United States Patent
Vella

(10) Patent No.: US 9,903,016 B2
(45) Date of Patent: Feb. 27, 2018

(54) DEVICE HAVING PREFORMED TRIPLE JUNCTIONS TO MAINTAIN ELECTRODE CONDUCTIVITY AND A METHOD FOR MAKING AND USING THE DEVICE

(71) Applicant: E/G ELECTRO-GRAPH, INC., Vista, CA (US)

(72) Inventor: Michael Vella, San Leandro, CA (US)

(73) Assignee: E/G Electro-Graph, Inc., Vista, CA (US)

( * ) Notice: Subject to any disclaimer, the term of this patent is extended or adjusted under 35 U.S.C. 154(b) by 0 days.

(21) Appl. No.: 15/389,964

(22) Filed: Dec. 23, 2016

(65) Prior Publication Data
US 2017/0107608 A1    Apr. 20, 2017

Related U.S. Application Data

(63) Continuation-in-part of application No. 14/921,611, filed on Oct. 23, 2015, now Pat. No. 9,551,061.

(60) Provisional application No. 62/067,693, filed on Oct. 23, 2014.

(51) Int. Cl.
| C23C 14/48 | (2006.01) |
| C23C 14/04 | (2006.01) |
| H01B 7/17 | (2006.01) |
| H01B 5/14 | (2006.01) |
| H01B 13/06 | (2006.01) |

(52) U.S. Cl.
CPC ............ *C23C 14/48* (2013.01); *C23C 14/048* (2013.01); *H01B 5/14* (2013.01); *H01B 7/17* (2013.01); *H01B 13/06* (2013.01)

(58) Field of Classification Search
CPC ......... C23C 14/48; C23C 14/048; H01B 5/14; H01B 7/17; H01B 13/06

USPC ........................................................ 174/126.1
See application file for complete search history.

(56) References Cited

U.S. PATENT DOCUMENTS

| 1,266,175 A | 5/1918 | Tesla |
| 4,560,879 A | 12/1985 | Wu et al. |
| 4,639,577 A | 1/1987 | Sturdevant |
| 5,739,628 A | 8/1998 | Takada |
| 6,046,533 A * | 4/2000 | Nakatsuka .............. C01B 13/11 313/355 |
| 6,156,099 A | 12/2000 | Hironaka et al. |

(Continued)

FOREIGN PATENT DOCUMENTS

| EP | 0854486 A1 * | 7/1998 | .......... H01B 13/062 |
| WO | 2004026461 A1 | 4/2004 | |

OTHER PUBLICATIONS

Levi Schächter, "Analytic expression for triple-point electron emission from an ideal edge", Appl. Phys. Lett. 72 (4), Jan. 26, 1998, pp. 421-423.

(Continued)

*Primary Examiner* — Timothy Thompson
*Assistant Examiner* — Charles Pizzuto
(74) *Attorney, Agent, or Firm* — Laurence A. Greenberg; Werner H. Stemer; Ralph E. Locher

(57) ABSTRACT

In systems where insulating deposits form during normal operation, electrodes are configured with a preformed dielectric thereon, wherein the preformed dielectric is formed with a geometric feature that preforms a triple junction. These triple junctions enhance low level discharge activity to facilitate localized breakdown of the deposits and maintain electrode conductivity.

17 Claims, 5 Drawing Sheets

(56) References Cited

U.S. PATENT DOCUMENTS

| | | |
|---|---|---|
| 6,576,909 B2 | 6/2003 | Donaldson et al. |
| 7,807,984 B2 | 10/2010 | Alcott et al. |
| 7,838,849 B2 | 11/2010 | Alcott et al. |
| 8,963,107 B2 | 2/2015 | Eisner et al. |
| 2003/0136505 A1 | 7/2003 | Wimmer |
| 2005/0221613 A1 | 10/2005 | Ozaki et al. |
| 2007/0069622 A1 | 3/2007 | Ohwada et al. |
| 2007/0102652 A1 | 5/2007 | Ring et al. |
| 2008/0164427 A1 | 7/2008 | Collart et al. |
| 2008/0315114 A1 | 12/2008 | Chang et al. |
| 2009/0258553 A1 | 10/2009 | Leek |
| 2010/0308299 A1* | 12/2010 | Hahn .................. H01L 29/22 257/9 |
| 2012/0252221 A1 | 10/2012 | De Brabander et al. |
| 2014/0184055 A1 | 7/2014 | Lauer et al. |
| 2016/0118220 A1 | 4/2016 | Vella |

OTHER PUBLICATIONS

M.S. Chung et al., "Configuration-dependent enhancements of electric fields near the quadruple and the triple junction", J. Vac. Sci. Technol. B 28(2), Mar./Apr. 2010, pp. C2A94-C2A97.

W.A. Stygar et al., "Improved design of a high-voltage vacuum-insulator interface", Physical Review Special Topics—Accelerators and Beams 8, 050401 (2005), pp. 050401-1-050401-16.

Bo H. Vanderberg et al, "Evaluation of Electrode Materials for Ion Implanters", Ieee 0-7803-X/99, pp. 207-210.

J. Kogelschatz et al., "Dielectric-Barrier Discharges. Principle and Applications" Journal de Physique IV, 1997, 07 (CA), pp. C4-47-C4-66.

S. Kajita et al., "Tungsten Erosion by the Initiation of Unipolar Arcs in Nuclear Fusion Devices", 30th ICPIG, Aug. 28-Sep. 2, 2011, Belfast, UK.

Robson et al. "An Arc maintained on an Isolated Metal Plate exposed to a Plasma", Proc. Phys. soc. 73, 508, 1959.

\* cited by examiner

DEVICE HAVING PREFORMED TRIPLE JUNCTIONS TO MAINTAIN ELECTRODE CONDUCTIVITY AND A METHOD FOR MAKING AND USING THE DEVICE

CROSS-REFERENCE TO RELATED APPLICATIONS

The present application is a continuation-in-part of co-pending U.S. patent application Ser. No. 14/921,611, filed on Oct. 23, 2015, which claimed benefit of Provisional Patent Application No. 62/067,693, filed on Oct. 23, 2014; those applications being incorporated herein, by reference, in their entireties.

BACKGROUND OF THE INVENTION

Field of the Invention

The invention relates to the use of localized electric field enhancement and, more particularly, to a device in which preformed triple junctions are provided in systems where insulating deposits form as part of normal operation.

Candidate conductors typically operate below the threshold for electrical breakdown in clean, ideal conditions. This allows for the degradation of voltage holding associated with the contamination expected in normal operation. Deposits can be a loose, unbound accumulation of material, such as, dust. Deposits can also take the form of an attached layer, or, be formed by chemical reaction. Examples where insulating deposits can form include corona rings, insulator gradient rings, and spark gaps exposed to contamination, such as, spark plugs. Electrodes in vacuum systems, such as, charged particle accelerators and plasma tools, are given special attention.

In liquid, gas, or vacuum environments, electrode contaminants can require maintenance, or, lead to high voltage breakdown. In semiconductor vacuum based manufacturing tools, such as, plasmas and ion beams, breakdowns can increase particle generation. On powered electrodes, hard power supply breakdowns (also called 'glitches'), can significantly increase particle generation. This is undesirable, as particles can cause yield loss in semiconductor manufacturing and, consequently, particle counts are routinely monitored. Tool qualification and continued operation requires maintaining particle counts below a maximum allowable tolerance. What is needed is a technology that can increase service life by maintaining threshold particle counts, which would increase service life and be economically desirable.

Electrodes, Insulators, and Triple Junctions:

Insulators are critical components of any electrical system, and mechanisms that cause insulator failure have been extensively studied. In vacuum, gas, or non-conducting liquid systems, the confluence of medium-metal-insulator is called a "triple junction" (or "triple point"). Electric field enhancement at vacuum triple junctions can cause insulator breakdown. See, for example, Schächter, "Analytic expression for triple-point electron emission from an ideal edge", Appl. Phys. Lett. 72 (4), 26 Jan. 1998; Chung et al., "Configuration-dependent enhancements of electric fields near the quadruple and the triple junction", J. Vac. Sci. Tech. B28, C2A94, 2010; Stygar et al., "Improved design of a high-voltage vacuum-insulator interface", Phys. Rev. ST Accel Beams 8, 050401 (2005).

In vacuum, an acute angle of intersection between insulator and cathode on the vacuum side can create a mathematical electric field singularity at the cathode triple junction. Then, electron field emission can create a creeping discharge along the insulator surface, and lead to eventual failure. An obtuse angle between insulator and anode can create a mathematical singularity in the electric field at the anode triple junction, which can lead to bulk insulator breakdown. Referring now to FIG. 1, one goal of research and development, according to U.S. Patent Application Publication No. 2014/0184055, has been to increase insulator service life by designing for an obtuse vacuum side angle 10 at the cathode 12 triple junction and an acute angle θ at the anode 14 triple junction. Concern for triple junction field enhanced breakdown extends from macro to submicron feature size. See, for example, U.S. Pat. No. 5,739,628 to Takada.

Study of vacuum triple junction breakdown is often done with clean vacuum, without free charge or ionizing radiation. So, study of the effect of deposits in a beam or plasma environments is relatively limited. However, even conductive deposits on electrodes in an ion beam can reduce the breakdown voltage to a fraction of that for clean electrodes. See, for example, Vanderberg, et. al., "Evaluation of electrode materials for ion implanters", IEEE 0-7803-X/99, pp. 207-210.

The presence of plasma introduces multiple issues compared with clean vacuum. Plasma provides free charge (mostly electrons) and radiation, especially UV, which has sufficient energy for ionization. Even a diffuse plasma implies Debye shielding for features larger than 0.01 cm. Free charge and UV radiation are obviously detrimental to insulator integrity, but the effect of Debye shielding is less obvious. Plasma sheaths are dynamic, with extremely high fluctuating electric fields over small distances. More importantly, the conformal nature of the sheath effectively makes the time averaged sheath electric field orthogonal to the material boundary. For example, in the case of a positive plasma or beam potential, a grounded boundary is at cold cathode potential, with the plasma as anode. At a triple junction, this effectively reproduces the long discarded geometry of a triple junction insulator at 90 degrees to the anode.

Semiconductor plasma and beam systems can be dc, rf, and/or pulse powered. They are used for etching, cleaning, doping, and material deposition. Semiconductor processes can be particularly harsh, sometimes even including simultaneous refractory temperatures, oxidizing chemicals, and energetic particle bombardment. Electrodes can accumulate deposits as process by-products. Electrodes that function as cathodes or cold cathodes in ion beam, plasma and other electrical systems and devices can lose emissivity if the surface becomes insulating. The surface can become insulating if it is covered by insulating/dielectric deposits, or, if its materials are modified to have dielectric properties. Insulating deposits are particularly troublesome, especially in the presence of free charge or ionizing radiation. Formation of in situ triple junctions can alleviate this loss of emissivity because they introduce enhanced emissivity.

Many systems have an intrinsic form of directionality. For large scale, high voltage systems exposed to atmosphere, this may be simply be gravity. Plasma and ion beam processes frequently rely on energetic particles. In this case, deposit formation can have directionality imparted by either the energetic particles, or, by material backscattered from the impact of energetic particles.

Transient, low current electrical breakdown activity is routinely present in systems with high electric field. In air or vacuum, this is called corona. Corona cleaning, or, plasma discharge cleaning, is well known, and has often been used as a conditioning process for high voltage electrodes. Transient activity can be monitored by fast tracking of electrode current or voltage. The definition of 'breakdown' is subjective, depending on system requirements. Some systems simply run until complete insulator failure. In other cases, the onset of transient discharges that exceed a current or voltage threshold triggers a power supply interruption to limit damage.

DESCRIPTION OF THE RELATED ART

A whole classes of industrial products, Siemens dielectric barrier discharges, make productive use of the properties of insulators on electrodes in plasma. See, for example, Kogelschatz et al., "Dielectric-Barrier Discharges. Principle and Applications", Journal de Physique IV, 1997, 07 (C4), pp.C4-47-C4-66.

Triple junction field enhancement has been productively extended to dielectric barrier discharge processes. See, for example PCT Application Publication No. WO 2004/026461 A1. Triple junction emission current density is geometry dependent, and is proportional to the dielectric coefficient, which can be anisotropic. Dielectric layers that form in situ on electrodes in ion beam, plasma and other electrical systems and devices can have variable qualities that depend on process conditions or environmental factors.

What is needed is a system, device and method for maintaining localized electrode surface conductivity and overall electrode functionality, while avoiding system breakdown thresholds. What is further needed is a system in which triple junctions are preformed using preferred dielectrics and/or geometries to promote discharge activity that creates localized plasma cleaning of portions of the electrode surface.

BRIEF SUMMARY OF THE INVENTION

It is accordingly an object of the invention to pre-form triple junctions having preferred dielectrics and/or geometries on electrode surfaces. Discharge activity around the triple junctions creates localized plasma cleaning, and thereby maintains localized electrode surface conductivity and overall electrode functionality.

Although the invention is illustrated and described herein as embodied in a device having preformed triple junctions to maintain electrode conductivity and a method for making and using the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

One goal of the present invention is to provide a system and method in which electrode features are shaped to form triple junctions. In one particular embodiment, a system and method are provided in which electrode features are shaped so that insulating deposits formed during normal operation create in-situ triple junctions. In another particular embodiment, triple junctions are preformed on the electrode. In one particular embodiment, the features during normal operation create in-situ triple junctions. Discharge activity at the triple junctions thus effects localized plasma cleaning in the areas of the triple junctions, thereby maintaining localized electrode surface conductivity and overall electrode functionality. With careful design, the effective angle of insulating deposits can be made acute with respect to the cathode boundary. This geometry is damaging to the insulator, as described in U.S. Patent Application Publication No. 2014/0184055 to Lauer et al. However, such insulator damage is desirable for purposes of the present invention, to perform localized cleaning or removal of insulating deposits that naturally form on the electrode surface. For semiconductor applications, another specific benefit is intended to be reduction of net particle generation over the service life cycle of the device.

Figure 1:
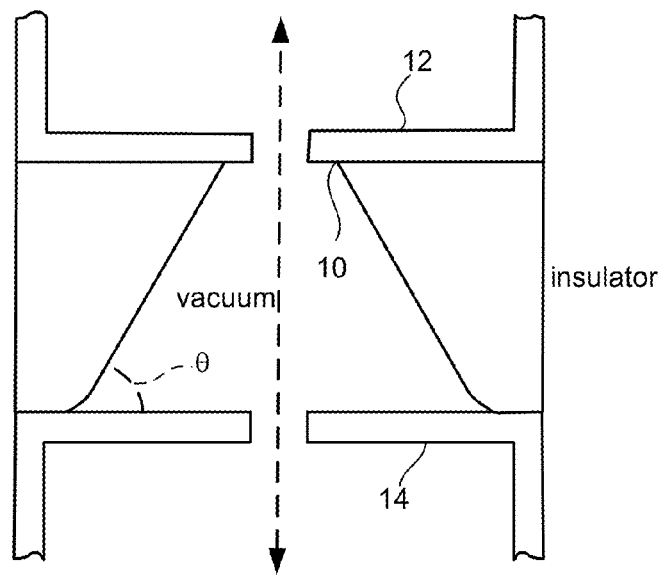
FIG. 1 is a cross-sectional view of a device having a dielectric body disposed between an anode and a cathode, in accordance with the prior art.
Figure 2:
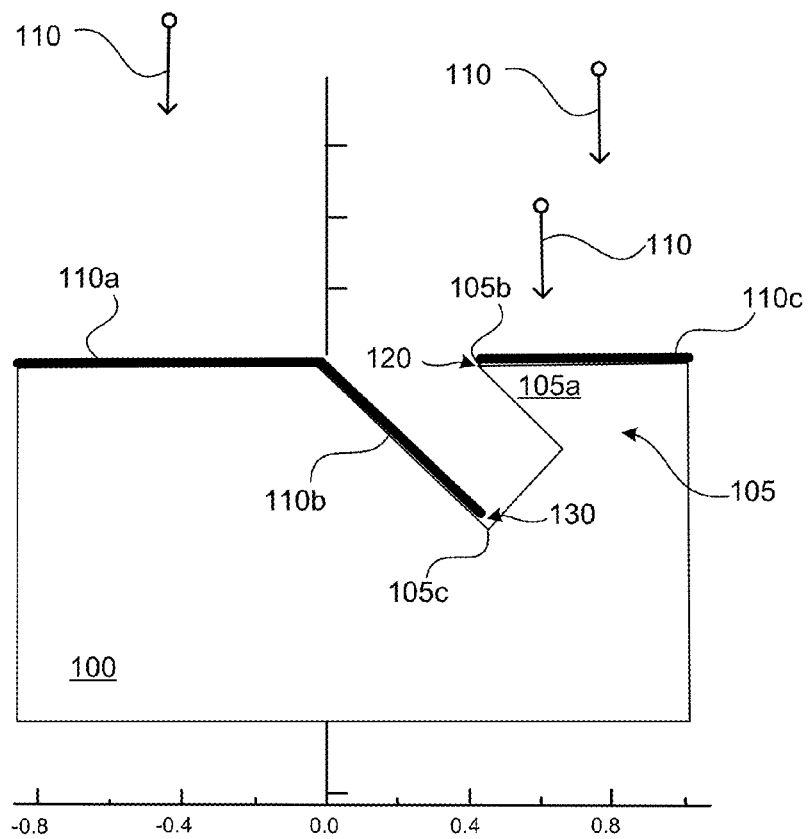
FIG. 2 is a simplified Illustration of a triple junction formed by insulating deposits that gravitationally accumulate in the shadow of a geometrically field enhanced top in accordance with one particular embodiment of the invention.

Referring now to FIG. 2, there is illustrated one particular embodiment of an electrode feature 105 that can be formed in the surface of an electrode 100, which is designed to take advantage of gravitational directionality so that insulating deposits accumulated in use form in situ triple junctions. More particularly, in the present embodiment, falling, deposit forming particles 110 accumulate on an exposed portion of the electrode feature 105, but not in shadow portions of the feature 105a. More particularly, the feature 105 is shaped to include a geometrically field enhanced top portion 105a of the feature 105 configured to cause two triple junctions 120, 130 to form on the electrode surface. In other words, the feature 105 is formed with one portion 105a that overhangs or overshadows a portion of the electrode surface of another part of the feature 105. Consequently, although the upper surface of the one portion 105a is exposed to the deposit forming particles 110, the remainder of the one portion 105a is shaped to shield a portion of the electrode surface from the falling deposit forming matter 110. Thus, a layer 110c of the insulating deposits forms on the upper surface of the one portion 105a, but not on the electrode surface in the shadow of the one portion 105a.

In the embodiment of FIG. 2, one triple junction 120 forms near the field enhanced tip 105b of the feature 105a, while the second triple junction 130 forms on a plane below the tip 105b. Note that the insulator thickness 110a, 110b, 110c can be small relative to the feature size, so the thicknesses illustrated in FIG. 2 are intended for illustrative purposes, and not to scale. Also, note that insulator 110b is at an acute angle relative to an electric field between the bottom 105c of the feature 105 and the opposite polarity electrode, beam, or plasma above electrode 100. The triple junctions 120, 130 will produce a localized discharge activity that causes a localized breakdown of the deposits formed on the surface of the electrode 100 in the areas of the triple junctions 120, 130, thereby maintaining localized electrode surface conductivity. Additionally, the triple junctions are not formed prior to use, but rather, the present invention takes advantage of the deposits resulting on the electrode surface during normal use to form in-situ triple junctions.

As with all of the geometric features that will be described herein, the feature 105 may be formed in the electrode by molding, cutting, milling, machining, 3-D printing or the like. For purposes of the present application, the term "shadow" is used to denote an area of a feature that is blocked from having deposits formed thereon by the shape of the feature and the directionality of the particles that form the deposits. For example, in the embodiment of FIG. 2, the shadow portion of the feature 105 is that area blocked from receiving deposits that gravitationally accumulate (i.e., in a downward direction) by the top feature 105a. Similarly, in other embodiments described herein, the "shadow" area of the feature is created as a portion of the feature shielded from the directional flow of deposit forming particles by another portion of the feature in the path. See, for example, the embodiments of FIGS. 4 and 5. Thus, shadow triple junctions form at points on electrode surface in which shielded or shadow regions intersect with regions upon which insulating deposits have formed.

Figure 3A:
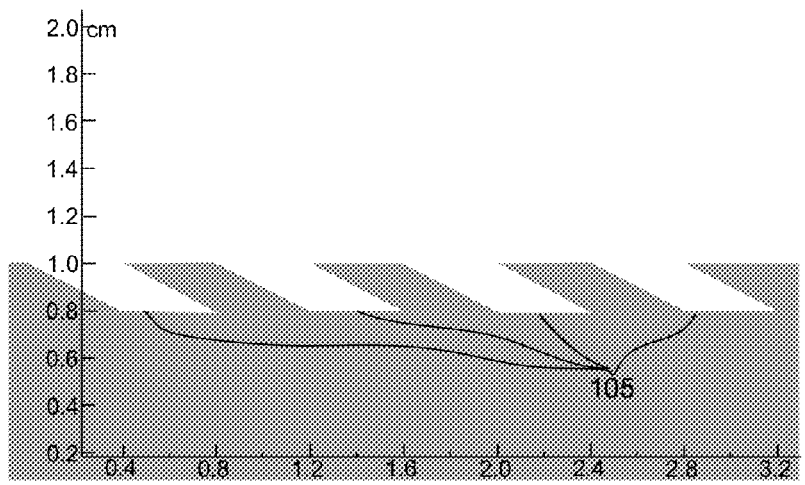
FIG. 3A is a simplified Illustration representing an array of electrode features in accordance with one particular embodiment, which is designed to form shadow triple junctions as an insulator coating accumulates.
Figure 3B:
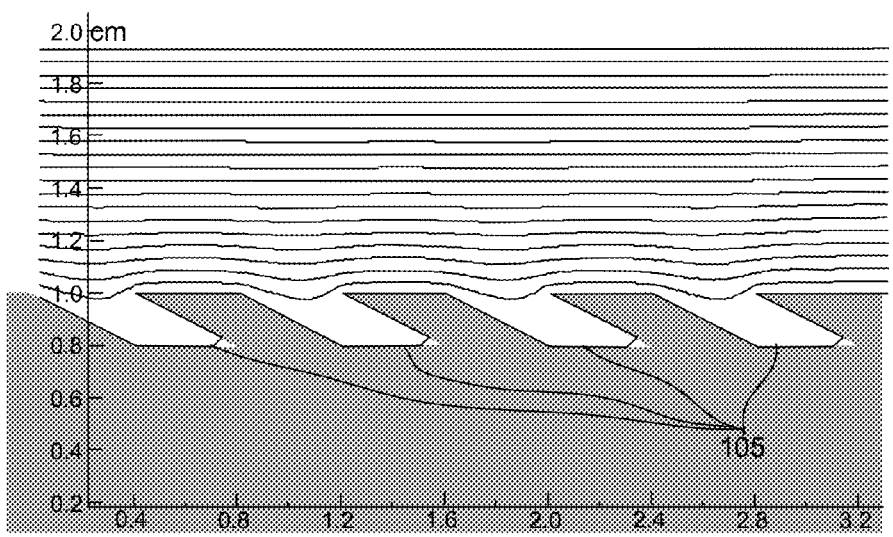
FIG. 3B is a graph illustrating the minimal impact an array of features, such as that of FIG. 3A, which is designed to create shadow triple junctions, has on simulated electrostatic potential contours between two electrodes.

Referring now to FIG. 3A, there is shown an array of electrode features 105 (i.e., which may be, for example, an array of the geometric features 105 of FIG. 2) that are designed to form shadow triple junctions as an insulator coating accumulates during normal electrode use. On a relative scale, similar features 105 could be embedded in any electrode. FIG. 3B shows a 2D electrostatic simulation for the electrode of FIG. 3A using a 10 kV, 1 cm planar electrode gap to illustrate that an array of the geometric features 105 has negligible effect on fields in the gap. In the illustrated simulation, the nominal increase in field strength is only 20%, and the effect disappears 10% of the distance into the gap. Similar to geometric field enhancement, the relative scaling of features is important for electrostatic fields, although important physical effects are sensitive to absolute scale.

Figure 4:
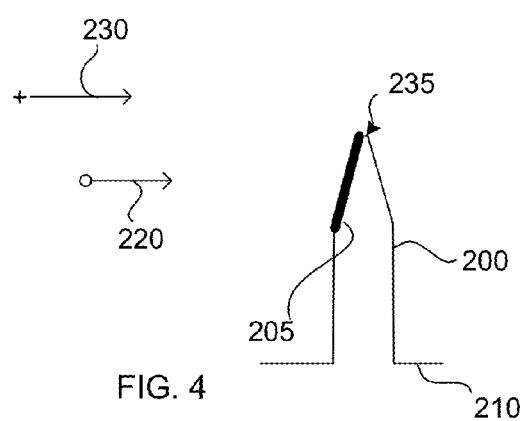
FIG. 4 is a simplified illustration of a single electrode fin orthogonal to insulating particles that are given directionality by energized charged particles to form a shadow triple junction useful in understanding the present invention.

Referring now to FIG. 4, there is shown one embodiment of a single electrode fin 200 formed on the surface of an electrode 210 orthogonal to insulating particles 220 that are given directionality by energized charged particles 230. Note that, although a single fin 200 is shown, an array of such fins can be formed on an electrode for the purposes of the present invention. More particularly, in a system with directionally energized ions, those ions have angular and energy dispersion. Via collisions with background gas, or, knockoff from surrounding walls, the energized ions create a dispersion of charged 230 and neutral 220 particles in same direction. If the energetic ions are poor elemental conductors, like silicon or boron, in situ triple junctions can be formed in the shadow (i.e., in this case, the angled face 205) of geometric features 200 designed for this purpose. In this case, the particle direction is shown orthogonal to the fin 200, and the triple junction 235 produces discharge activity that is additive to the corona activity due to the geometric field enhancement generated by the fin 200, itself, thus producing localized breakdown of the deposits formed thereon. The relative angle of the face 205 of the fin 200 can be adjusted as required for optimization, and, as discussed above, the idea can be extended to an array.

Figure 5:
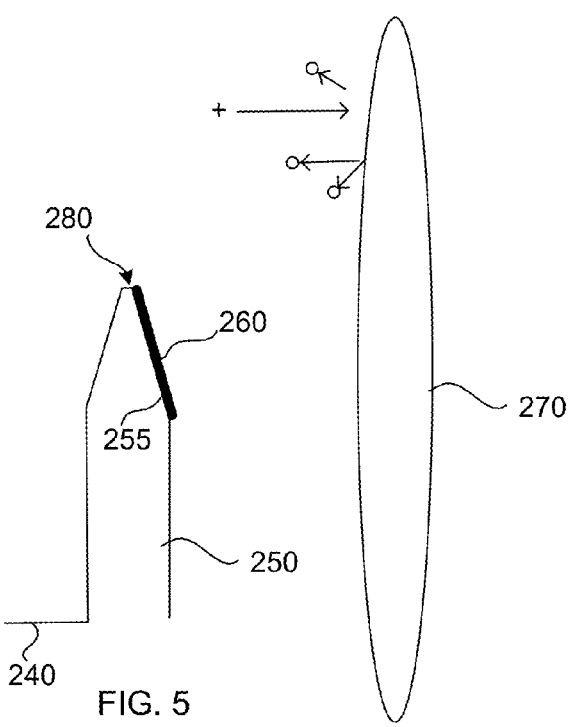
FIG. 5 is a simplified illustration of a single electrode fin showing the formation of a shadow triple junction by insulating material backscattered from a process surface, in accordance with one particular embodiment of the present invention.

FIG. 5 illustrates that backscatter from the impact of energetic particles can also be used to create shadow triple junctions on a geometric feature 250 designed for this purpose. In the particularly illustrated embodiment, the geometric feature 250 is a fin 250 or array of fins 250 that is provided on the surface of an electrode 240. Again, as with the previous embodiment, for purposes of illustrating the insulating layer 260 formed, the features are not to scale. In this case, the fin 250 is shown as parallel to the process surface 270, but the relative angle can obviously be adjusted to maximize benefit, and the idea can be extended to an array of fins 250. Thus, insulating material backscattered from the process surface 270 builds up on the angled face 255 of the feature 250, but not the other side (i.e., the shadow side), thus forming a triple junction 280. The triple junction 280 will encourage discharge activity that will clean the deposits from the tip of the feature 250. Additionally, the geometric feature, itself will produce a geometric field enhancement that results in corona activity at the tip, thus producing localized breakdown of the deposits formed thereon.

Figure 6:
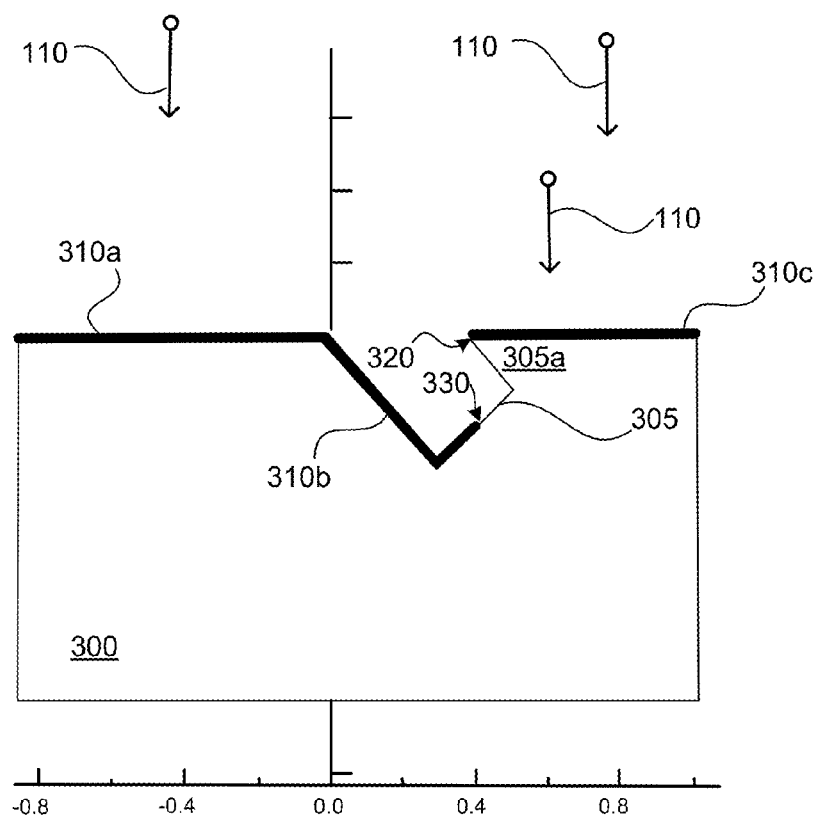
FIG. 6 is a simplified illustration of two proximate triple junctions formed by insulating deposits that gravitationally accumulate in the shadow of a geometrically enhanced field, in accordance with one embodiment of the present invention.

In systems with directionality, triple junction features can be located proximate to other triple junction features for the mutual benefit of discharge activity, as schematically illustrated in FIG. 6; in this case, directionality normal to the surface, e.g., gravitation. An electrode 300 is formed including one or more geometric features 305, the top feature 305a of which creates a shadow that protects a portion of the feature 305 from deposits particles 110. Thus, deposits 310a, 310b and 310c form on the surfaces of the electrode and in the portion of the feature not overshadowed by the top feature 305a. As the deposits form the insulating layer 310c, a shadow triple junction 320 forms on the backside of the top feature 305a, which has some geometric field enhancement.

Similarly, as the deposits 110 form an insulating layer 310b, a second shadow planar triple junction 330 forms below the first shadow triple junction 320. The two triple junctions 320, 330 are close enough to one another to enhance the local discharge activity.

In anticipation of contamination, electrodes can be manufactured with features that promote the formation of triple junctions in-situ, in order to create localized cleaning discharge activity. Additional advantages can be obtained using known insulators with controlled dielectric and material properties.

Accordingly, the present embodiment of the invention relates to, among other things, the deliberate introduction of in situ triple junctions in systems where insulating deposits form during normal operation.

Figure 7:
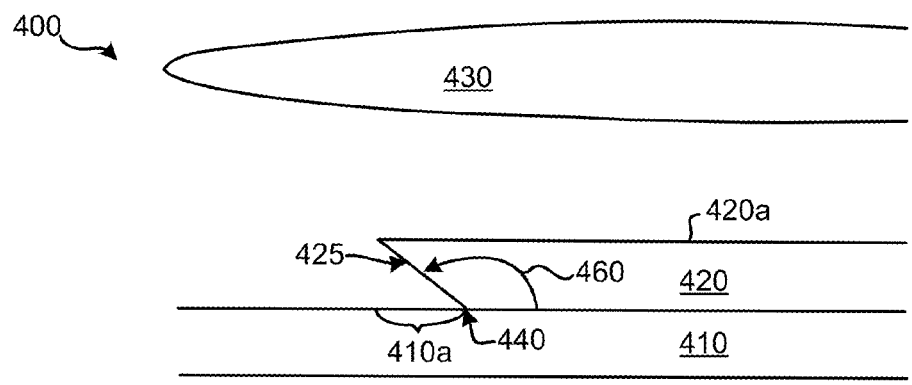
FIG. 7 illustrates a device including a preformed triple junction fabricated using a preformed dielectric layer on an electrode in accordance with another embodiment of the present invention.
Figure 8:
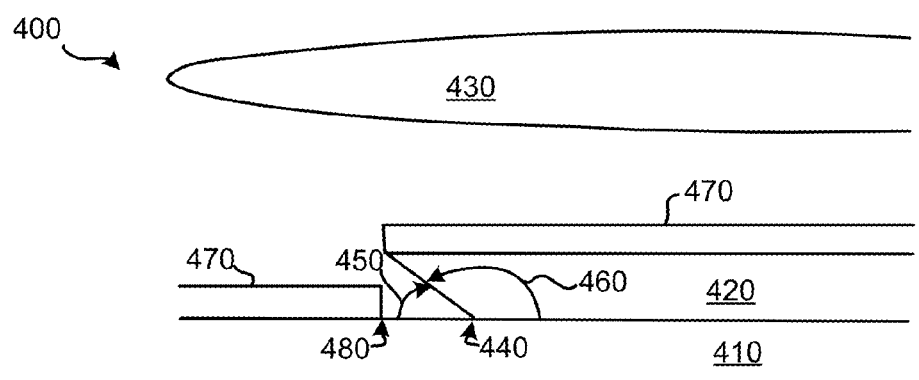
FIG. 8 illustrates a device including a preformed triple junction fabricated using a preformed dielectric layer on an electrode, and including an in situ triple junction formed by insulating deposits in accordance with another embodiment of the present invention.

Referring now to FIGS. 7-8, there is shown another embodiment of the present invention wherein preformed dielectric layers 420 are created on electrodes 410 to produce consistent triple junctions on the electrodes. Dielectric layers that form in situ on electrodes in ion beam, plasma and other electrical systems and devices, such as those described in connection with FIGS. 2-6. can have variable qualities that depend on process conditions or environmental factors. One way to ensure reliability and consistency of the triple junctions is to introduce preformed triple junctions that use preferred dielectrics and/or geometries.

The system 400 includes a simple, preformed triple junction 440. More particularly, a conducting cathode 410 includes a dielectric 420, preformed thereon (i.e., intentionally preformed, not during use), and a relative positive potential region 430 that can be a conducting anode, a positive ion plasma or a positive ion beam, which form an electrode/dielectric/vacuum interface triple junction 440. At least a portion of the preformed dielectric 420 is intentionally designed to include a geometric feature that overhangs a portion of the cathode 410, thus keeping the portion of the cathode 410 beneath the geometric feature clear of insulating deposits. This maintains the vacuum interface of the triple junction 440 free of insulating deposits. In one particular embodiment illustrated in FIG. 7, the geometric feature includes the end face 425 of the dielectric 420 is angled up and away from the surface of the cathode 410, thus providing an overshadowed region 410a, under which the cathode 410 remains clear of deposits. Compare, for example, FIGS. 7 and 8. The cathode/dielectric/vacuum interface triple junction 440 is thus created prior to use.

Triple junction electric field enhancement and emissivity are enhanced if the vacuum angle 450 between the dielectric 420 and conductor 410 is less than or equal to the dielectric angle 460. See, for example, Schachter, "Analytic expression for triple-point electron emission from an ideal edge", Appl. Phys. Leu. 72 (4), 26 Jan. 1998; Chung el al., "Configuration-dependent enhancements or electric fields near the quadruple and the triple junction", J. Vac. Sci. Tech. B28, C2A94, 2010. For a flat cathode, as illustrated in FIG. 7, this simply means that the vacuum angle 450 is less than or equal to 90 degrees.

Although a single exemplary triple junction 440 is shown in FIG. 7, the invention is not meant to be limited solely thereto, as more triple junctions can be used, for example, an array of triple junctions 440 can be formed, without departing from the scope or spirit of the present embodiment. Also, the placement and angle of the preformed triple junction relative to region 430 can be optimized for each application, as desired.

The dielectric material of preformed dielectric 420 can be optimized based on its dielectric coefficient and application compatibility. For example, glass ($SiO_2$), silicon nitride, and diamond provide a modest dielectric coefficient, but are semiconductor process compatible. Materials with a much higher dielectric coefficient are available, such as, tantalum oxide.

Referring now to FIGS. 7 and 8, conducting or insulating layers 470 can form on top of the cathode 410 or preformed dielectric 420, while leaving the preformed triple junction 440 functional. If the layer 470 is dielectric, then an in situ triple junction 480 can form as a result of the deposited dielectric layer 470.

Figure 9:
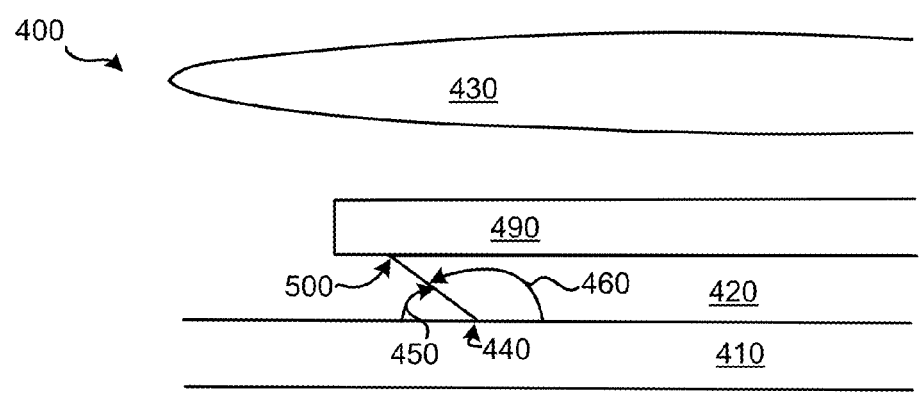
FIG. 9 illustrates a device including a preformed triple junction fabricated using a conducting shield in accordance with another embodiment of the present invention.

The simple configuration illustrated in FIG. 7 has the disadvantage that the top surface of the preformed dielectric 420 is exposed to process and environmental degradation. For example, in a system with free charges, such as a plasma, charge accumulation on the exposed surface 420a can lead to unipolar arcing, which creates particles. An improved configuration to address the foregoing issue is illustrated in FIG. 9. More particularly, a conducting shield or conductor 490 is provided over the preformed dielectric 420. Conductor 490 can be electrically floating, tied to cathode, or, biased to a preferred potential, as desired. Conductor 490 can end flush with end of dielectric 420, or can overhang the end of the dielectric, as illustrated in FIG. 9. Additionally, if desired, the end of the conductor 490 can be angled for geometric field enhancement.

Figure 10:
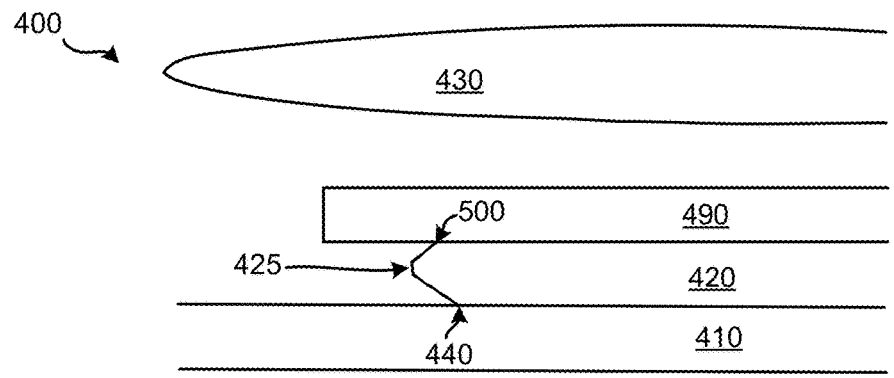
FIG. 10 illustrates a device including a preformed triple junction fabricated in accordance with another embodiment of the present invention, wherein the preformed dielectric layer is shaped to optimize the vacuum angles for the preformed triple junctions.

The addition of the conducting shield 490 creates an additional preformed triple junction 500, although in this case the vacuum angle to the cathode is not optimized for field enhancement. However, if desired, an end face 425 of the preformed dielectric 420 can be shaped to optimize both vacuum angles, i.e., the vacuum angle to the cathode 440 and to the conductor 490, as illustrated in FIG. 10.

Figure 11:
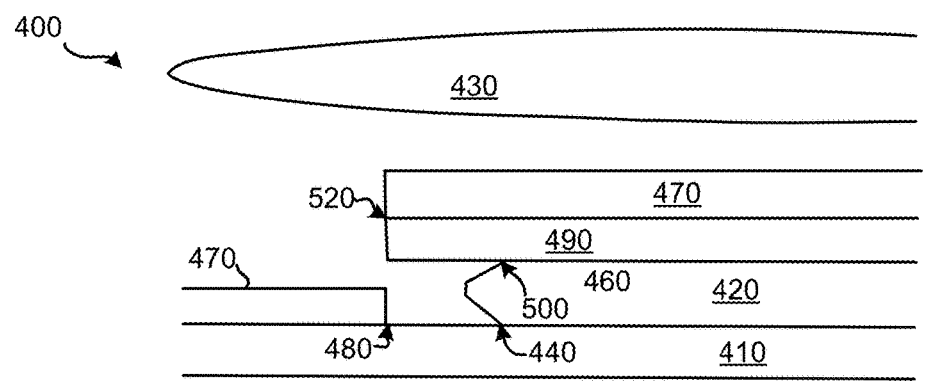
FIG. 11 illustrates a device including both preformed triple junctions and in situ triple junctions formed during use in accordance with another embodiment of the present invention.

It should be noted, that the advantages provided by the introduction of preformed triple junctions can also benefit from the additional formation of in situ triple junctions during use. As illustrated in FIG. 11, if the exposed conducting surfaces of the device 400 accumulate insulating deposits or are modified to become insulating, the resulting interfaces can form in situ triple junctions 480 and 520, as discussed above in connection with FIGS. 2-6.

The triple junctions created, as described above herein, provide enhanced low level discharge activity that facilitates localized breakdown of the deposits on the electrodes to maintain electrode conductivity. In semiconductor manufacturing tools, an expected benefit is net particle reduction.

While a preferred embodiment of the present invention is shown and described herein, it will be understood that the invention may be embodied otherwise than as herein specifically illustrated or described, and that within the embodiments certain changes in the detail and construction, as well as the arrangement of the parts, may be made without departing from the principles of the present invention as defined by the appended claims.

The invention claimed is:

1. A method of making an electrode, comprising the steps of:
    preforming a dielectric layer on a surface of the electrode, the dielectric layer including at least one geometric feature configured to overshadow a portion of the surface of the electrode to create a triple junction at a resulting electrode/dielectric/vacuum interface; and
    shielding, with the geometric feature, the portion of the surface from exposure to deposit forming particles in use to maintain the triple junction.

2. The method of claim 1, wherein said at least one geometric feature is an array of geometric features configured to shield a plurality of portions of the electrode surface from exposure to the deposit forming particles in use.

3. The method of claim 1, further comprising the steps of:
determining a directionality of the deposit forming particles in an environment in which the electrode is to be used; and
configuring the geometric feature to shield the portion of the electrode surface from deposit forming particles from the determined direction.

4. The method of claim 1, further comprising the step of forming in situ triple junctions on the electrode during use.

5. The method of claim 1, further comprising the step of preforming, before use, a conductive shield over the dielectric layer, the conductive shield overhanging at least a portion of the dielectric layer and the electrode.

6. The method of claim 1, wherein said geometric feature is an angled end face of the dielectric layer.

7. The method of claim 6, further comprising the step of preforming a conductive shield over the dielectric layer, the conductive shield overhanging at least a portion of the dielectric layer and at least a portion of the electrode surface.

8. The method of claim 7, wherein said angled end face has a first angled portion forming a electrode/dielectric/vacuum interface triple junction and a second angled portion not collinear with the first angled portion forming a second triple junction at the conductive shield/dielectric/vacuum interface.

9. An electrode having a surface comprising:
a preformed dielectric layer on a surface of the electrode;
the preformed dielectric layer including at least one geometric feature creating a triple junction at an electrode/dielectric/vacuum interface, the at least one geometric feature configured to overshadow a portion of the electrode surface and shield the portion of the electrode from exposure to deposit forming particles in use.

10. The electrode of claim 9, wherein said at least one geometric feature is an array of said at least one geometric features.

11. The electrode of claim 9, wherein the at least one geometric feature is an angled end face of said dielectric layer.

12. The electrode of claim 9, further comprising a conductive shield disposed over the dielectric layer, the conductive shield overhanging at least a portion of the dielectric layer.

13. The electrode of claim 12, wherein said at least one geometric feature is an angled end face of said dielectric layer having a first angled portion forming said electrode/dielectric/vacuum interface triple junction and a second angled portion not collinear with the first angled portion forming a second triple junction at a conductive shield/dielectric/vacuum interface.

14. A method of generating a localized breakdowns of deposits formed on a surface of an electrode, comprising the steps of :
providing an electrode according to claim 9;
orienting the electrode in a high voltage system with the dielectric layer positioned for exposure to deposit forming particles;
said at least one triple junction generating, when the system is in use, localized discharge activity to breakdown at least a portion of the deposits on said electrode.

15. The method of claim 14, wherein the at least one geometric feature is an array of the at least one geometric features.

16. The method of claim 14, wherein the electrode further comprises a conductive shield disposed over the dielectric layer, the conductive shield overhanging at least a portion of the dielectric layer.

17. The method of claim 16, wherein said at least one geometric feature is an angled end face of said dielectric layer having a first angled portion forming said electrode/dielectric/vacuum interface triple junction and a second angled portion not collinear with the first angled portion forming a second triple junction at a conductive shield/dielectric/vacuum interface.

\* \* \* \* \*